(12) United States Patent
Dang

(10) Patent No.: US 10,811,306 B2
(45) Date of Patent: Oct. 20, 2020

(54) PREPARATION METHOD OF MULTILAYER MONOCRYSTALLINE SILICON FILM

(71) Applicant: Shenyang Silicon Technology Co., Ltd., Shenyang (CN)

(72) Inventor: Qisen Dang, Shenyang (CN)

(73) Assignee: Shenyang Silicon Technology Co., Ltd., Shenyang (CN)

( * ) Notice: Subject to any disclaimer, the term of this patent is extended or adjusted under 35 U.S.C. 154(b) by 134 days.

(21) Appl. No.: 16/249,982

(22) Filed: Jan. 17, 2019

(65) Prior Publication Data

US 2019/0237357 A1 Aug. 1, 2019

(30) Foreign Application Priority Data

Jan. 26, 2018 (CN) .......................... 2018 1 0075920

(51) Int. Cl.
*H01L 21/02* (2006.01)
*H01L 21/762* (2006.01)
*H01L 21/306* (2006.01)
*H01L 21/324* (2006.01)

(52) U.S. Cl.
CPC .. *H01L 21/76251* (2013.01); *H01L 21/02052* (2013.01); *H01L 21/30625* (2013.01); *H01L 21/324* (2013.01); *H01L 21/76256* (2013.01)

(58) Field of Classification Search
CPC .................................................. H01L 21/187
USPC ....................................................... 438/459
See application file for complete search history.

(56) References Cited

U.S. PATENT DOCUMENTS

| | | | | |
|---|---|---|---|---|
| 2007/0063217 | A1* | 3/2007 | Brogan | H01L 29/66143 257/133 |
| 2011/0195560 | A1* | 8/2011 | Gaudin | H01L 21/76256 438/459 |
| 2012/0001293 | A1* | 1/2012 | Ben Mohamed | H01L 21/185 257/506 |

FOREIGN PATENT DOCUMENTS

| | | |
|---|---|---|
| CN | 106409649 A | 2/2017 |
| CN | 106409650 A | 2/2017 |

* cited by examiner

*Primary Examiner* — Selim U Ahmed
(74) *Attorney, Agent, or Firm* — Maier & Maier, PLLC

(57) ABSTRACT

A preparation method of a multilayer monocrystalline silicon film sequentially includes: first, taking two monocrystalline silicon slices of which surfaces are clean, processing the surfaces of the silicon slices by a plasma activation technology, and then, performing pre-bonding; transferring the bonded silicon slices to an annealing furnace having a temperature of 200-300° C., and performing annealing for 6-10 hours to avoid generating a transition region and to completely bond the two silicon slices; thinning the annealed bonded slices to a desired target thickness; and taking the thinned SOI slice as Si-1, taking another monocrystalline silicon slice as Si-2, and performing the first three steps on Si-1 and Si-2 to obtain the multilayer monocrystalline silicon film. The silicon slices that are processed by the plasma activation technology have a large pre-bonding force during bonding. A favorable bonding effect is achieved after annealing.

7 Claims, 1 Drawing Sheet

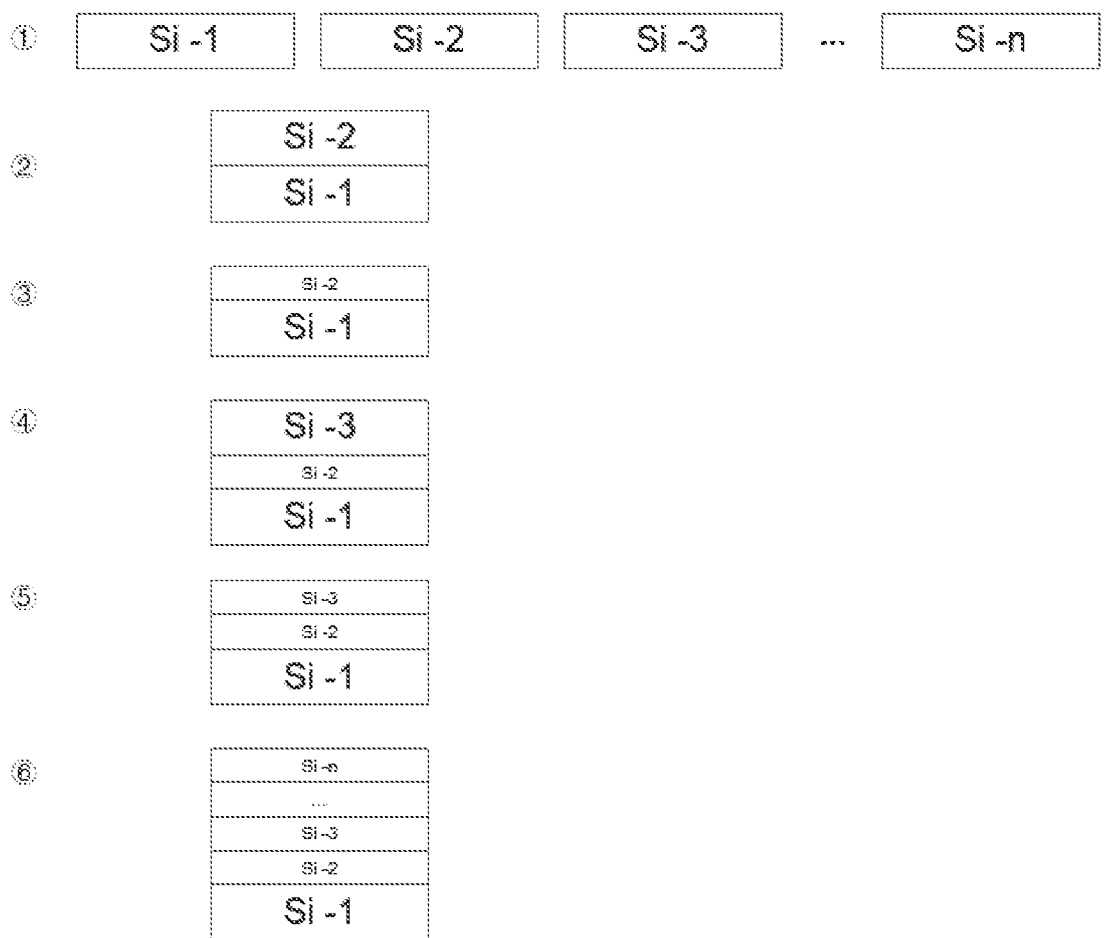

PREPARATION METHOD OF MULTILAYER MONOCRYSTALLINE SILICON FILM

TECHNICAL FIELD

The present invention relates to the technical field of preparation of a multilayer monocrystalline silicon film and particularly provides a preparation method of a multilayer monocrystalline silicon film.

BACKGROUND

In the prior art, Chinese patent application documents with the application numbers of 201510460906.6 and 201510481429.1 disclose preparation methods of multilayer monocrystalline silicon films, which are relatively complicated in operation and unsatisfactory in technical effect. There are still many technical problems that need to be solved. For example, obvious resistance transition regions still exist between the layers of the multilayer monocrystalline silicon films.

A multilayer monocrystalline silicon film with a favorable technical effect is highly expected.

SUMMARY

An objective of the present invention is to provide a multilayer monocrystalline silicon film with a favorable technical effect.

The present invention provides a preparation method of the multilayer monocrystalline silicon film, sequentially comprising:

(1) first, taking two silicon slices Si-1 and Si-2, washing and cleaning surfaces of the two silicon slices by means of a conventional wet process, processing the surfaces for 5-20 s by a plasma activation technology under a vacuum condition with a vacuum degree of smaller than 1 Torr to enhance a pre-bonding force during bonding, and performing pre-bonding;

(2) heating the pre-bonded silicon slices from a room temperature to a constant temperature of 200-300° C. at a rate of 5-10° C./min, and performing annealing for 6-10 hours at the constant temperature to avoid generating a transition region and to completely bond the two silicon slices;

(3) thinning the annealed bonded silicon slices obtained from step (2) by means of coarse grinding, fine grinding and polishing until Si-2 at the top layer reaches a thickness of 2-100 μm;

(4) treating an SOI silicon slice obtained in step (3) as an integral Si-1, taking another silicon slice Si-3 as the Si-2, and repeating the steps (1)-(3) for Si-1 and Si-2 to obtain a Si-1/Si-2/Si-3 multilayer SOI silicon slice; and (5) repeating the step (4) to obtain a multilayer SOI silicon slice (Si-1/Si-2/ . . . /Si-n) with required numbers of layers.

Additional information: (1) during preparation of the multilayer monocrystalline silicon film, the highest temperature is 300° C., and a multilayer SOI silicon slice obtained at this temperature has no obvious transition region between layers; (2) there is no specific requirements on the selected silicon slices; generally, the adjacent two layers have different specific resistance or doping types; for example, Si-1 is a heavily doped slice, Si-2 is a lightly doped slice, or Si-1 is a P-type silicon slice, and Si-2 is an N-type silicon slice; (3) the annealed bonded silicon slices obtained from step (2) are thinned by means of coarse grinding, fine grinding and polishing until Si-2 at the top layer reaches a thickness of 2-100 μm; generally, a relatively thicker Si film could not be obtained easily on Si-1 by means of epitaxial growth; but the thickness of the new silicon slice can be controlled at 70 μm/60 μm/50 μm very easily according to the present invention.

Preferably, the preparation method of the multilayer monocrystalline silicon film further has the following technical content.

In the preparation method of the multilayer monocrystalline silicon film, said thinning the silicon slice to the required thickness sequentially comprises coarse grinding, fine grinding and chemical-mechanical polishing using a grinding and polishing machine 8761 produced by Disco, which is a grinding and polishing all-in-one machine that is provided with an online measurement tool through which the silicon slice may be thinned to the required thickness (2-100 μm).

The surfaces are processed by the plasma activation technology to enhance a pre-bonding force during bonding and a finally formed bonding force. The two cleaned silicon slices to be bonded are taken. The surfaces to be bonded of the silicon slices are aligned. Pre-bonding is performed in a vacuum environment (low degree of vacuum).

Before said processing the surfaces of the silicon slices by the plasma activation technology to enhance the pre-bonding force during bonding, said washing and cleaning the surfaces of the silicon slices by means of the conventional wet process conventionally and sequentially comprises: cleaning with a chemical liquid SC1, cleaning with $H_2O$, cleaning with a chemical liquid SC2, and cleaning with $H_2O$. The chemical liquid SC1 contains the following ingredients with the following proportion: $NH_4OH:H_2O_2:H_2O=1:5:40$. The chemical liquid SC2 contains the following ingredients with the following proportion: $HCl:H_2O_2:H_2O=1:2:20$. $H_2O$ is deionized water.

The preparation method further comprises: treating the bonded two silicon slices as a whole, taking another silicon slice, performing wet cleaning on surfaces of the two, and then performing plasma activation; after that, aligning the surfaces to be bonded of the two, and performing pre-bonding in a vacuum environment; annealing the forgoing pre-bonded slices at 200-300° C. for 6-10 hours to completely bond the two silicon slices; and performing thinning by means of coarse grinding, fine grinding and chemical-mechanical polishing to obtain a film with a required thickness.

The number of the silicon slices of the multilayer monocrystalline silicon film is preferably 2 to 5 here, which is preferably 4-30 layers since 2 or 3 layers are included in the forgoing content. If each layer has a required thickness, the required thickness may be specified in detail.

For any two adjacent monocrystalline silicon slices, the monocrystalline silicon slices have TTV smaller than 1 μm, SFQR smaller than 0.3 μm, surface roughness Rms smaller than 0.5 nm, thickness of 450 μm to 750 μm and specific resistance of 0.01-1,000 ohm·cm.

Specifically, TTV is short for total thickness variation, SFQR is short for site flatness front least-squares range, and Rms is short for root mean square roughness.

Preferably, the number of the silicon layers of the multilayer monocrystalline silicon film is 2 to 5; and for any two adjacent monocrystalline silicon slices, the monocrystalline silicon slices are N-type or N-type monocrystalline silicon slices, and the two adjacent monocrystalline silicon slices have different specific resistance or doping types.

The preparation method has the following advantages: during bonding, the pre-bonding force is large and the bonding effect is favorable; no obvious resistance transition regions exists between the layers; the thickness of single-layer monocrystalline silicon may be effectively controlled; a comprehensive technical effect is favorable; and the economical values and the social values are huge.

BRIEF DESCRIPTION OF THE DRAWINGS

FIG. 1 is a schematic view of a preparation principle of a multilayer monocrystalline silicon film.

DETAILED DESCRIPTION

Additional information of FIG. 1:
(1) Si-1/Si-2/Si-3/Si-n each represents a monocrystalline silicon slice with a clean surface; and
(2) Si-1/Si-2/Si-3/Si-n each represents a silicon slice that is ground and polished to a certain target thickness.

Embodiment 1

A preparation method of a multilayer monocrystalline silicon film sequentially comprises:
(1) first, taking two silicon slices Si-1 and Si-2, washing and cleaning surfaces of the two silicon slices by means of a conventional wet process, processing the surfaces for 5-20 s by a plasma activation technology under a vacuum condition (the degree of vacuum is smaller than 1 Torr) to enhance a pre-bonding force during bonding, and performing pre-bonding;
(2) heating the pre-bonded silicon slices from a room temperature to a constant temperature of 200-300° C. at a rate of 5-10° C./min, and performing annealing for 6-10 hours at the constant temperature to avoid generating a transition region and to completely bond the two silicon slices;
(3) thinning the annealed bonded silicon slices obtained from step (2) by means of coarse grinding, fine grinding and polishing until Si-2 at the top layer reaches a thickness of 2-100 μm;
(4) treating an SOI silicon slice obtained in step (3) as an integral Si-1, taking another silicon slice Si-3 as the Si-2, and repeating the steps (1)-(3) for Si-1 and Si-2 to obtain a Si-1/Si-2/Si-3 multilayer SOI silicon slice; and
(5) repeating the step (4) to obtain a multilayer SOI silicon slice (Si-1/Si-2/ . . . /Si-n) with required numbers of layers.

Specifically, the multilayer SOI silicon slice obtained from step (4) is regarded as Si-1. Take another silicon slice as Si-2. Repeat steps (1)-(3) until the required number of layers is obtained.

Additional information: (1) during preparation of the multilayer monocrystalline silicon film, the highest temperature is 300° C., and a multilayer SOI silicon slice obtained at this temperature has no obvious transition region between layers; (2) there is no specific requirements on the selected silicon slices, generally, the adjacent two layers have different specific resistance or doping types; for example, Si-1 is a heavily doped slice, Si-2 is a lightly doped slice, or Si-1 is a P-type silicon slice, and Si-2 is an N-type silicon slice; (3) the annealed bonded silicon slices obtained from step (2) are thinned by means of coarse grinding, fine grinding and polishing until Si-2 at the top layer reaches a thickness of 2-100 μm; generally, a relatively thicker Si film could not be obtained easily on Si-1 by means of epitaxial growth; but the thickness of the new silicon slice can be controlled at 70 μm/60 μm/50 μm very easily according to the present invention.

The preparation method of the multilayer monocrystalline silicon film further has the following supplementary content.

Said thinning the silicon slice to the required thickness particularly comprises coarse grinding, fine grinding and chemical-mechanical polishing using a grinding and polishing machine 8761 produced by Disco, which is a grinding and polishing all-in-one machine that is provided with an online measurement tool through which the silicon slice may be processed with the required thickness (2-100 μm).

The surfaces are processed by the plasma activation technology to enhance a pre-bonding force during bonding and a finally formed bonding force. The two cleaned silicon slices to be bonded are taken. The surfaces to be bonded of the silicon slices are aligned. Pre-bonding is performed in a vacuum environment (low degree of vacuum).

Before said processing the surfaces of the silicon slices by the plasma activation technology to enhance the pre-bonding force during bonding, said washing and cleaning the surfaces of the silicon slices by means of the conventional wet process conventionally and sequentially comprises: cleaning with a chemical liquid SC1, cleaning with $H_2O$, cleaning with a chemical liquid SC2, and cleaning with $H_2O$. The chemical liquid SC1 contains the following ingredients in the following proportion: $NH_4OH:H_2O_2:H_2O=1:5:40$. The chemical liquid SC2 contains the following ingredients in the following proportion: $HCl:H_2O_2:H_2O=1:2:20$. $H_2O$ is deionized water.

The preparation method further comprises: treating the bonded two silicon slices as a whole, taking another silicon slice, performing wet cleaning on surfaces of the two, and then performing plasma activation; after that, aligning the surfaces to be bonded of the two, and performing pre-bonding in a vacuum environment; annealing the forgoing pre-bonded slices at 200-300° C. for 6-10 hours to completely bond the two silicon slices; and performing thinning by means of coarse grinding, fine grinding and chemical-mechanical polishing to obtain a film with a required thickness.

The number of the silicon slices of the multilayer monocrystalline silicon film is 2 to 5.

For any two adjacent monocrystalline silicon slices, the monocrystalline silicon slices have the following geometric parameters before bonding: TTV smaller than 1 μm, SFQR smaller than 0.3 μm, surface roughness Rms smaller than 0.5 nm, thickness of 450 μm to 750 μm and specific resistance of 0.01-1,0000 ohm·cm. The monocrystalline silicon slices are P-type monocrystalline silicon slices or N-type monocrystalline silicon slices. The two adjacent monocrystalline silicon slices have different specific resistance or doping types.

According to the embodiment, during bonding, the pre-bonding force is large and the bonding effect is favorable; no obvious resistance transition regions exists between the layers; the thickness of single-layer monocrystalline silicon may be effectively controlled; a comprehensive technical effect is favorable; and the economical values and the social value are huge.

The invention claimed is:
1. A preparation method of a multilayer monocrystalline silicon film, comprising:
(1) taking two silicon slices Si-1 and Si-2, washing and cleaning surfaces of the two silicon slices by a conventional wet process, processing the surfaces for 5-20 seconds by a plasma activation technology under a vacuum condition with a vacuum degree of smaller than 1 Torr to enhance a pre-bonding force during bonding, and performing pre-bonding;

(2) heating the pre-bonded silicon slices from a room temperature to a constant temperature of 200-300° C. at a rate of 5-10° C./min, and performing annealing for 6-10 hours at the constant temperature;

(3) thinning Si-2 at the top layer to a required thickness of 2-100 µm by coarse grinding, fine grinding and polishing of the bonded slices;

(4) treating an SOI silicon slice obtained in step (3) as an integral Si-1, taking another silicon slice Si-3 as the Si-2, and repeating the steps (1)-(3) for Si-1 and Si-2 to obtain a Si-1/Si-2/Si-3 multilayer SOI silicon slice; and (5) repeating step (4) to obtain a multilayer SOI silicon slice (Si-1/Si-2/ . . . /Si-n) with required numbers of layers.

2. The preparation method of the multilayer monocrystalline silicon film according to claim 1, wherein said thinning the silicon slice to the required thickness sequentially comprises coarse grinding, fine grinding and chemical-mechanical polishing using a grinding and polishing all-in-one machine.

3. The preparation method of the multilayer monocrystalline silicon film according to claim 2, wherein the surfaces of the silicon slices are processed by the plasma activation technology to enhance a pre-bonding force during bonding and a finally formed bonding force, the two cleaned silicon slices to be bonded are taken, the surfaces to be bonded of the silicon slices are aligned, and pre-bonding is performed in a vacuum environment.

4. The preparation method of the multilayer monocrystalline silicon film according to claim 2, wherein before the processing of the surfaces of the silicon slices by the plasma activation technology to enhance the pre-bonding force during bonding, said washing and cleaning the surfaces of the silicon slices by the conventional wet process conventionally and sequentially comprises: cleaning with a chemical liquid SC1, cleaning with $H_2O$, cleaning with a chemical liquid SC2, and cleaning with $H_2O$, wherein the chemical liquid SC1 contains the following ingredients in the following proportion: $NH_4OH:H_2O_2:H_2O=1:5:40$, the chemical liquid SC2 contains the following ingredients in the following proportion: $HCl:H_2O_2:H_2O=1:2:20$, and $H_2O$ is deionized water.

5. The preparation method of the multilayer monocrystalline silicon film according to claim 1, further comprising: treating the bonded two silicon slices as a whole, taking another silicon slice, performing wet cleaning on surfaces of the two, and then performing plasma activation; after that, aligning the surfaces to be bonded of the two, and performing pre-bonding in a vacuum environment; annealing the forgoing pre-bonded slices at 200-300° C. for 6-10 hours to completely bond the two silicon slices; and performing thinning by coarse grinding, fine grinding and chemical-mechanical polishing to obtain a film with a required thickness.

6. The preparation method of the multilayer monocrystalline silicon film according to claim 5, wherein
the number of the silicon layers of the multilayer monocrystalline silicon film is 2 to 30; and
for any two adjacent monocrystalline silicon slices, the monocrystalline silicon slices have TTV smaller than 1 µm, SFQR smaller than 0.3 µm, surface roughness Rms smaller than 0.5 nm, thickness of 450 µm to 750 µm and specific resistance of 0.01-1,000 ohm·cm.

7. The preparation method of the multilayer monocrystalline silicon film according to claim 6, wherein
the number of the silicon layers of the multilayer monocrystalline silicon film is 2 to 5; and
for any two adjacent monocrystalline silicon slices, the monocrystalline silicon slices are N-type or N-type monocrystalline silicon slices, and the two adjacent monocrystalline silicon slices have different specific resistance or doping types.

* * * * *